(12) United States Patent
McKnight-MacNeil et al.

(10) Patent No.: US 9,589,869 B2
(45) Date of Patent: Mar. 7, 2017

(54) PACKAGING SOLUTIONS FOR DEVICES AND SYSTEMS COMPRISING LATERAL GaN POWER TRANSISTORS

(71) Applicant: GaN Systems Inc., Ottawa (CA)

(72) Inventors: Cameron McKnight-MacNeil, Nepean (CA); Greg P. Klowak, Ottawa (CA); Ahmad Mizan, Kanata (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/064,955

(22) Filed: Mar. 9, 2016

(65) Prior Publication Data

US 2016/0268185 A1    Sep. 15, 2016

Related U.S. Application Data

(60) Provisional application No. 62/131,308, filed on Mar. 11, 2015.

(51) Int. Cl.
*H01L 23/495*   (2006.01)
*H01L 21/56*    (2006.01)
(Continued)

(52) U.S. Cl.
CPC ...... *H01L 23/49503* (2013.01); *H01L 21/565* (2013.01); *H01L 21/78* (2013.01); *H01L 23/3107* (2013.01); *H01L 23/4824* (2013.01); *H01L 23/492* (2013.01); *H01L 23/4952* (2013.01); *H01L 23/49524* (2013.01);
(Continued)

(58) Field of Classification Search
CPC .................................................. H01L 21/565
See application file for complete search history.

(56) References Cited

U.S. PATENT DOCUMENTS

2015/0162252 A1    6/2015 Klowak et al.

FOREIGN PATENT DOCUMENTS

| WO | 2012103633 A1 | 8/2012 |
| WO | 2015061881 A1 | 5/2015 |

OTHER PUBLICATIONS

He, Ate et al.; "All-Copper Chip-to-Substrate Interconnects Part II. Modeling and Design", J. Electrochem. Soc., 155(4)D314-D322 (2008).

(Continued)

*Primary Examiner* — Seahvosh Nikmanesh
(74) *Attorney, Agent, or Firm* — Miltons IP/p.i.

(57) ABSTRACT

Packaging solutions for devices and systems comprising lateral GaN power transistors are disclosed, including components of a packaging assembly, a semiconductor device structure, and a method of fabrication thereof. In the packaging assembly, a GaN die, comprising one or more lateral GaN power transistors, is sandwiched between first and second leadframe layers, and interconnected using low inductance interconnections, without wirebonding. For thermal dissipation, the dual leadframe package assembly can be configured for either front-side or back-side cooling. Preferred embodiments facilitate alignment and registration of high current/low inductance interconnects for lateral GaN devices, in which contact areas or pads for source, drain and gate contacts are provided on the front-side of the GaN die. By eliminating wirebonding, and using low inductance interconnections with high electrical and thermal conductivity, PQFN technology can be adapted for packaging GaN die comprising one or more lateral GaN power transistors.

21 Claims, 10 Drawing Sheets

(51) Int. Cl.
    H01L 21/78      (2006.01)
    H01L 23/00      (2006.01)
    H01L 23/31      (2006.01)
    H01L 23/498     (2006.01)
    H01L 23/492     (2006.01)
    H01L 23/482     (2006.01)

(52) U.S. Cl.
    CPC .. *H01L 23/49562* (2013.01); *H01L 23/49575* (2013.01); *H01L 23/49861* (2013.01); *H01L 24/17* (2013.01); *H01L 24/32* (2013.01); *H01L 24/33* (2013.01); *H01L 24/73* (2013.01); *H01L 24/81* (2013.01); *H01L 24/83* (2013.01); *H01L 24/92* (2013.01); *H01L 24/97* (2013.01); *H01L 2224/13147* (2013.01); *H01L 2224/16245* (2013.01); *H01L 2224/245* (2013.01); *H01L 2224/29139* (2013.01); *H01L 2224/32225* (2013.01); *H01L 2224/32245* (2013.01); *H01L 2224/33181* (2013.01); *H01L 2224/37147* (2013.01); *H01L 2224/73203* (2013.01); *H01L 2224/81191* (2013.01); *H01L 2224/81801* (2013.01); *H01L 2224/8384* (2013.01); *H01L 2224/83801* (2013.01); *H01L 2224/92143* (2013.01); *H01L 2924/01014* (2013.01); *H01L 2924/04642* (2013.01); *H01L 2924/1033* (2013.01); *H01L 2924/13064* (2013.01); *H01L 2924/13091* (2013.01); *H01L 2924/17747* (2013.01)

(56) References Cited

OTHER PUBLICATIONS

Lee, Han S.; "GaN-on-Silicon-Based Power Switch in Sintered, Dual-Side Cooled Package", Power Electronics, Jan. 2, 2013; 10 pages.

Yannou, Jean-Marc et al.; "Analysis of innovation trends in packaging for power modules", 7th European Advance Technology Workshop on Micropackaging and Thermal Management, IMAPS 2012, Feb. 1-2, 2012; 33 pages.

Patterson, Deborah S.; "2.5/3D Packaging Enablement through Copper Pillar Technology", Chip Scale Review, May-Jun. 2012; pp. 20-26.

Amkor Technology Inc.; "3D Bondwire Electrical Modeling Results" 2001; pp. 1-3.

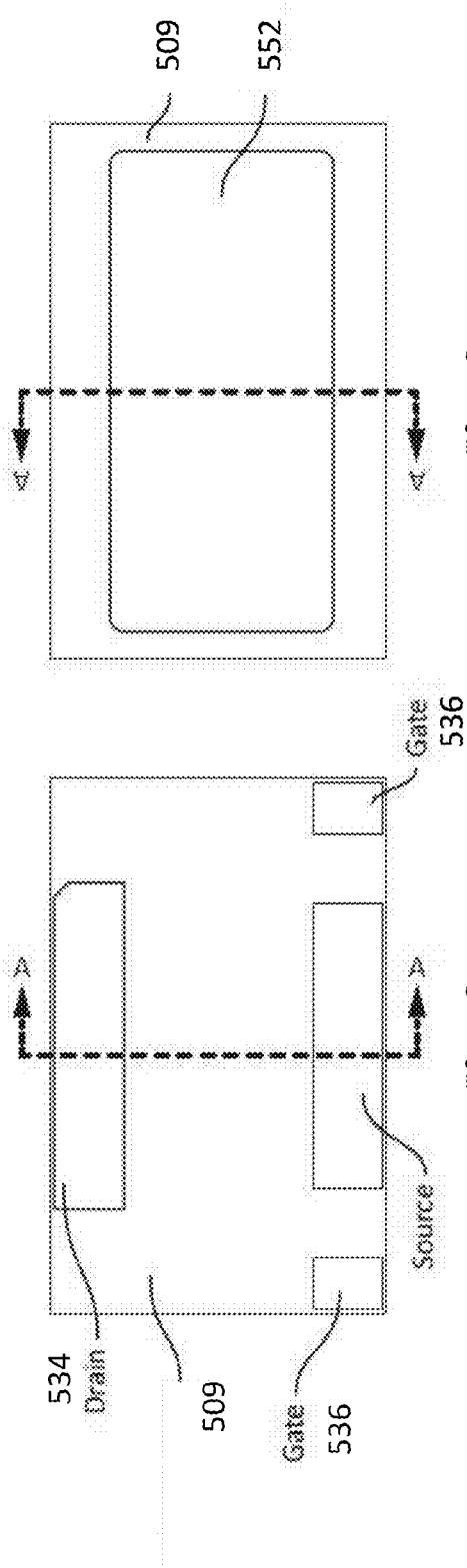
Fig. 8
Fig. 9
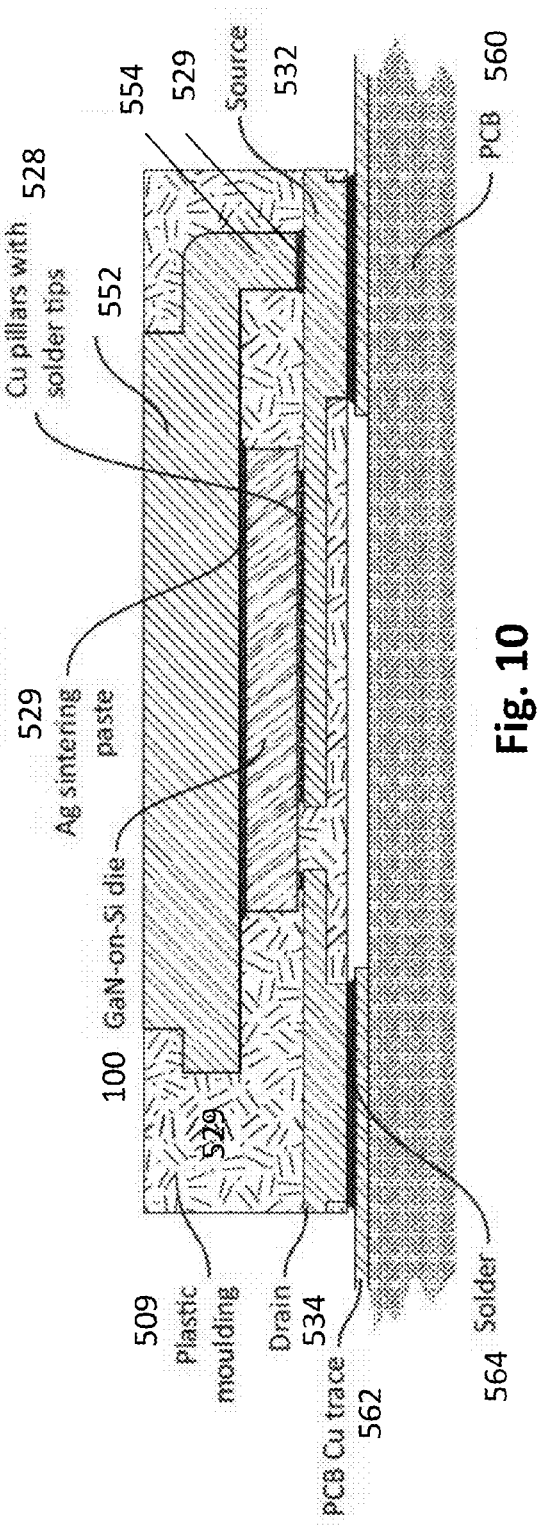
Fig. 10

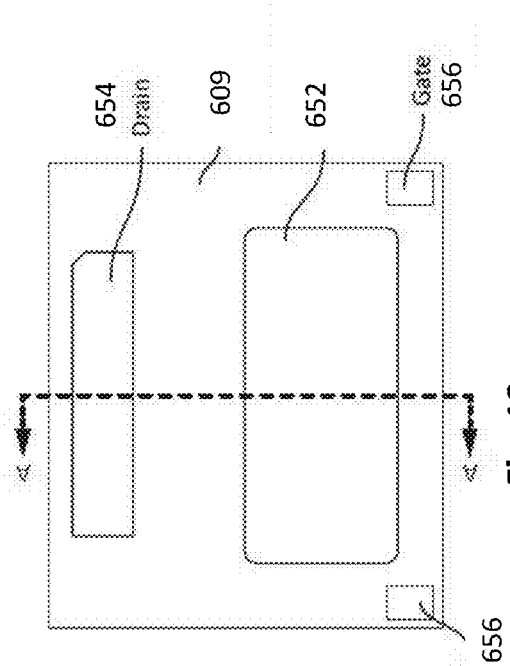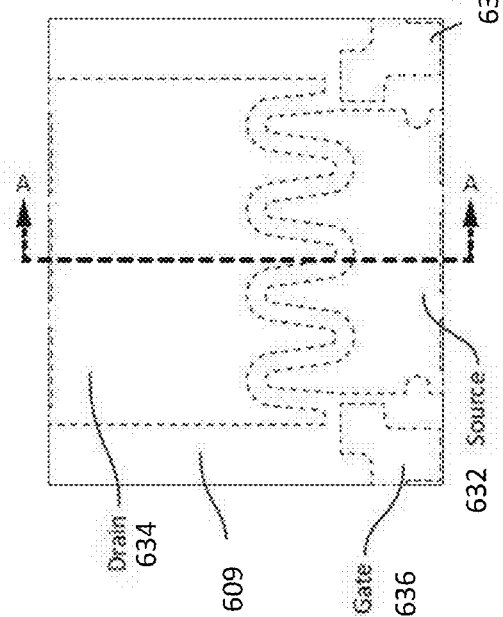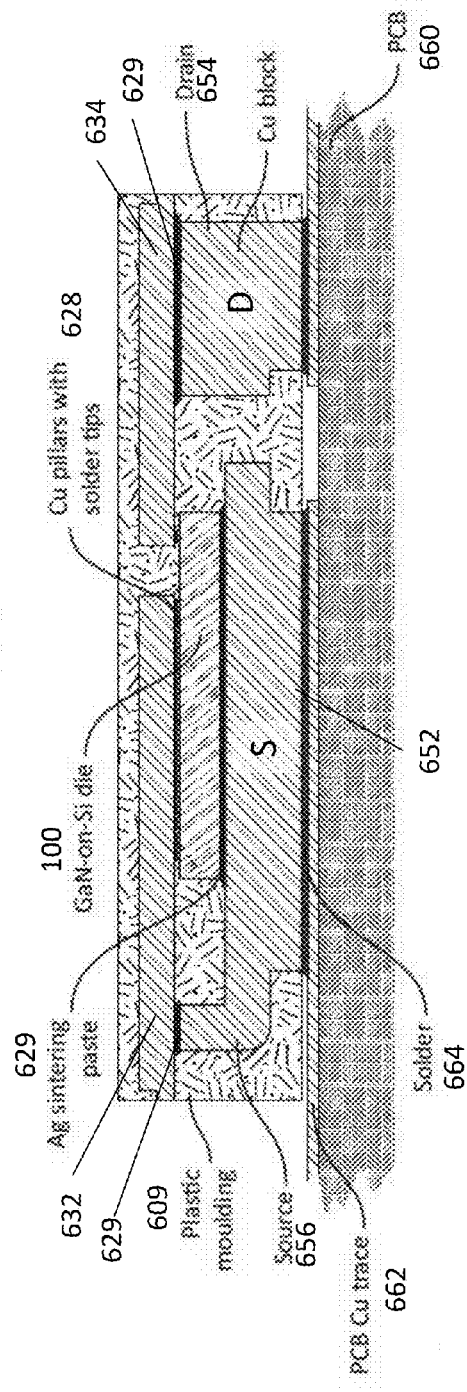

PACKAGING SOLUTIONS FOR DEVICES AND SYSTEMS COMPRISING LATERAL GAN POWER TRANSISTORS

CROSS-REFERENCE TO RELATED APPLICATIONS

This application claims priority from U.S. Provisional patent application No. 62/131,308, filed Mar. 11, 2015, entitled "PACKAGING SOLUTIONS FOR DEVICES AND SYSTEMS COMPRISING LATERAL GaN POWER TRANSISTORS", which is incorporated herein by reference in its entirety.

This application is related to U.S. Provisional patent application No. 62/131,293, filed Mar. 11, 2015, entitled "PACKAGING SOLUTIONS FOR DEVICES AND SYSTEMS COMPRISING LATERAL GaN POWER TRANSISTORS", which is incorporated herein by reference in its entirety.

TECHNICAL FIELD

The present invention is related to packaging solutions for devices and systems comprising large area, lateral Gallium Nitride (GaN) power transistors and other high current/high voltage nitride semiconductor devices.

BACKGROUND

GaN devices are expected to be widely adopted for power switches as production costs are reduced, for example, by fabrication of lateral GaN transistors on lower cost silicon substrates (GaN-on-Si die). Lateral GaN power transistors offer low on-resistance $R_{on}$ and high current capability per unit active area of the device. To benefit from the inherent performance characteristics of lateral GaN transistors, important design considerations include, for example, device layout (topology), low inductance packaging and effective thermal management.

For larger area lateral switching power transistors capable of switching 20 Amps or more, using conventional device topologies, where large area contact pads are provided around the periphery of the chip, the length of conductive tracks of on-chip metallization becomes very long. The resistance of the on-chip metallization can be comparable to, or even greater than, the $R_{on}$ of the transistor itself. Furthermore, these long tracks introduce inductance, which significantly degrades the switching performance.

Correspondingly, much energy is wasted, which goes simply to heating or overheating of the track. This tends to put an upper limit on the practical size of such power transistors. PCT International patent application No. PCT/CA2012/000080 entitled "Gallium nitride power devices using island topography", (GaN Systems Inc.), and related applications, disclose GaN switching devices using Island Technology®. This topology for lateral GaN transistors mitigates this problem by providing the ability to take high current directly on and off the chip to/from each island, thus minimizing the length of the on-chip tracks. That is, contact areas are distributed over the active area of the device. This topology provides a low on resistance ($R_{on}$), low inductance, and a compact structure with a gate width double that of a conventional multi-finger design of a similar device size, with superior current handling per unit area. A breakdown voltage exceeding 1200V can be achieved.

Another large area, multi-island, transistor structure is disclosed in PCT International application No. PCT/CA2014/000762 and US Patent application No. U.S. Ser. No. 14/568,507, each entitled "Fault Tolerant Design for Large Area Nitride Semiconductor Devices" (GaN Systems Inc.), which claim priority from US Provisional Patent application No. U.S. Ser. No. 61/896,871, filed 29 Oct. 2013. These patent applications disclose redundant-cell, yield enhancement techniques, providing a practical approach, which allows for manufacturing of larger dies. For example, large gate width devices may be fabricated having a current switching capability in excess of 100 A.

To take advantage of these novel structures and other large area, lateral GaN power devices for high voltage/high current applications, improved interconnect and packaging schemes are required. Packaging solutions are required that offer both low inductance interconnections and effective thermal management.

Packaging solutions currently used for power devices typically comprise one of two main types of structures. Firstly, there are a number of industry standard power modules for packaging one or more power devices that are based on conventional wirebond solutions for bare die. For example, the back-side (substrate) of a semiconductor die comprising a power transistor is mounted on a thermal substrate of a power module, using conventional back-side die-attach techniques, soldering or sintering. Then, source, drain and gate connections between the contact pad areas on the front-side of the die and the metal contact areas of the packaging module are then made by conventional wirebonding. External connections of the packaging module may comprise various standard arrangements of pins or leads.

Alternatively, there are many variants of PQFN (Power Quad Flat No Lead) type packages. These packages typically comprise organic or ceramic substrates, which provide external metal contact pads, e.g. copper lands, instead of leads or pins. For packaging of vertical power devices, where source or drain contacts may be provided on the back-side of the GaN die, PQFN packages provide a copper die pad and may use wirebonds, copper clips, or flip-chip on leadframe interconnections. For example, some PQFN packages use a copper clip to hold the power transistor die in place and provide thermal contact with a thermal substrate.

For lateral GaN power devices, some known drawbacks of these existing packaging solutions include, e.g.:
  a conventional PQFN package for vertical power transistors provides a back-side source connection, and front-side drain and gate connections, whereas for lateral GaN power transistors, all electrical connections, i.e. source, drain and gate contact areas are made to the front-side (top) of the GaN die;
  such PQFN packages are not configured to provide a ground connection between a front-side source contact and the die substrate/thermal pad within the package;
  for lateral GaN power transistors, electrical issues of wirebonding include insufficient current handling and excessive inductance of the long thin lengths of wirebonds;
  wirebonding solutions may require many layers of wirebonds and take up significant space, i.e. tend to be large in the vertical dimension (tall/thick/high profile), which places physical limitations on the design of power modules;
  there is a significant mismatch of CTE (Coefficient of Thermal Expansion) between a GaN-on-Si die and the copper die pad of standard PQFN package or the ceramic substrate of a power module;

the copper die pad of a standard PQFN package adds extra thermal resistance compared to a bare die on a ceramic substrate of a conventional wirebonded power module.

Thus, there is a need for alternative packaging solutions and/or improvements that provide for one or more of increased current handling, reduced inductance, improved thermal management, and a lower profile package, which can be manufactured at a cost that is similar to, or lower than, existing packaging solutions.

In particular, there is a need for alternative or improved packaging schemes for nitride power semiconductor devices, such as GaN power transistors and for systems comprising one or more lateral GaN power transistors.

SUMMARY OF INVENTION

The present invention seeks to provide alternative or improved packaging for nitride semiconductor devices, such as GaN power transistors and systems using one or more lateral GaN power transistors.

Aspects of the present invention provide components of a packaging assembly, a semiconductor device structure, which comprises a dual leadframe structure; and a method for fabrication of a packaging assembly in which a GaN die, comprising one or more lateral GaN power transistors, is sandwiched between the first and second leadframe layers.

One aspect of the invention provides a packaging assembly comprising a lateral GaN power transistor fabricated on a semiconductor substrate (GaN die) and packaging components comprising first and second leadframe layers;

the GaN die comprising a front surface providing source, drain and gate contact areas for the lateral GaN power transistor and a back surface for die-attach;

the GaN die being sandwiched between the first and second leadframe layers;

the first leadframe layer being patterned to provide source, drain and gate portions corresponding to source, drain and gate contact areas on the front surface of the GaN die;

the second leadframe layer comprising a thermal pad and providing a die-attach area for the back surface of the GaN die;

the back surface of the GaN die being attached to the die-attach area of the second leadframe layer by a low inductance layer of an electrically and thermally conductive attachment material;

the source, drain and gate contact areas of the GaN die being attached and electrically connected to respective source, drain and gate portions of the first leadframe layer using low inductance interconnections; and a package body comprising an over-molding of encapsulation which leaves exposed the thermal pad of the second leadframe layer and leaves exposed external contact pads of the first leadframe layer for the source, drain and gate of the lateral GaN transistor.

In preferred embodiments, the first and second leadframe layers may comprise copper or copper alloys, e.g. which may be formed, stamped or etched to form the leadframe and clip components. Other suitable metals and alloys typically used for leadframes may alternatively be used. The low inductance interconnections preferably comprise metal bumps or metal posts.

In an embodiment, the external pads or lands for the source, drain and gate contacts are part of the first leadframe layer and are provided on one side of the package body and the exposed thermal pad is provided on an opposite side of the package body. The second leadframe layer comprising the thermal pad also comprises a source clip, which extends laterally of the die substrate and is vertically interconnected to the source portion of the first leadframe layer, thereby providing a substrate source connection for grounding the die substrate to the source.

In another embodiment the second leadframe layer comprises source, drain and gate portion and the external contact pads for the source, drain and gate comprise part of the respective source, drain and gate portions of the second leadframe layer; and the respective source, drain and gate portions of the first and second copper leadframe layers are vertically interconnected, within the package body, by low inductance interconnections comprising a layer of electrically conductive and thermally conductive material, and each of the external pads for the source, gate and drain contacts and the exposed thermal pad are provided on one side of the package body.

For example, the thermal pad may be part of the source portion of the second copper leadframe layer, which is grounded to the source portion of the first copper leadframe layer within the package body, such that the thermal pad provides the external pad for the source contact, and the drain and gate portions of the second copper leadframe layer are electrically connected to respective drain and source portions of the first copper leadframe layer, said drain and gate portions of the second copper leadframe layer providing external pads for drain and gate contacts on the same side of the package body as the external pad providing the source contact and thermal pad.

In another embodiment, the second leadframe layer comprising the thermal pad further comprises a source clip, which extends laterally of the die substrate and is vertically interconnected to the source portion of the first leadframe layer, thereby providing a substrate source connection for grounding the die substrate to the source, i.e. the exposed surface of the thermal pad acts as the substrate source contact area. A drain clip portion of the second leadframe layer is formed laterally of the die substrate and is vertically interconnected to the drain portion of the first leadframe layer. The drain clip portion provides a drain contact area coplanar with the surface of thermal pad which provides the source contact area. The drain clip portion may be formed from a part of the second copper leadframe layer or be formed from a separate copper block or post.

In preferred embodiments, the first and second leadframe layers comprise copper or copper alloys, and for example, where the semiconductor substrate is silicon or silicon carbide, a preferred attachment material for attaching the back surface of the GaN die to the die-attach area of second copper leadframe layer is sintered silver, which provides a low inductance electrical connection with good thermal conductivity. For low inductance interconnections for the source, drain and gate interconnections, beneficially, the metal bump or post connections interconnecting contact areas of the GaN die and respective source, drain and gate portions of the leadframe comprise solder tipped copper pillars.

To assist in registration or alignment of the multiple bump and post connections, the first and second leadframe layers may provide registration means for mutually positioning the first and second copper leadframe layers with respective source, drain and gate interconnections in alignment during fabrication For example, in an embodiment, the registration means comprises tabs on the second copper leadframe layer and corresponding slots in the first copper leadframe layer, the tabs and slots inter-engaging to mutually register the first and second leadframes vertically and horizontally during assembly. In another embodiment, the registration means comprises tabs on the first copper leadframe layer and corresponding slots in the second copper leadframe layer.

In some embodiments, the device structure has the external form of a PQFN type package, which includes an exposed thermal pad for heat dissipation. The package is adapted to provide low inductance interconnections, without wirebonding, and improved thermal dissipation for larger GaN power devices and systems. The second leadframe layer provides an exposed thermal pad, and also allows for an internal substrate-source connection, i.e. for grounding the die substrate to the front-side source pads within the package.

Another aspect of the invention provides a method of fabricating a semiconductor device structure comprising an assembly of: a lateral GaN power transistor fabricated on a semiconductor substrate (GaN die) and packaging components comprising first and second leadframe layers encapsulated within a package body, the method comprising:

providing the GaN die comprising a front surface providing source, drain and gate contact areas for the lateral GaN power transistor and a back surface for die-attach;
providing a first leadframe layer and a second leadframe layer;
the second leadframe layer providing a thermal pad and a die-attach area for the back surface of the GaN die;
attaching the back surface of the GaN die being attached to the die-attach area of the second leadframe layer with a low inductance layer of electrically and thermally conductive attachment material;
providing low inductance bump or post connections for source, drain and gate contact areas of the GaN die, and providing a layer of conductive and thermally conductive attachment material for other surfaces of the first and second leadframe layers to be electrically interconnected;
mutually positioning or registering the first and second leadframes to align respective source, drain and gate contacts thereof, with bump or post connections or other electrically conductive attachment material therebetween;
processing, e.g. performing sintering or reflow of, the bump or post connections and the attachment material to vertically attach, and thermally and electrically interconnect the source, drain and gate contact areas of the GaN die and respective source, drain and gate portions of the first leadframe layer; and
providing a package body comprising an over-molding of encapsulation, exposing the thermal pad of the second leadframe layer and exposing the external contact pads for the source, drain and gate of the lateral GaN transistor.

Beneficially, to facilitate assembly, the first and second leadframe layers are each formed similar to conventional leadframes, comprising a supporting frame surrounding said source, drain, gate or thermal pad portions and the method further comprises removing said supporting frames of the first and second leadframes after assembly, e.g. during device singulation.

Advantageously, said first and second leadframe layers are provided with registration means, for example tabs of one leadframe layer for inter-engagement with slots of the other leadframe layer, and wherein the method further comprises inter-engaging said tabs and slots for mutual registration, vertically and horizontally, of the first and second leadframe layers during assembly.

The method simplifies assembly of components for a package assembly, such as, a MicroLeadFrame (MLF) type or PQFN type package, for GaN dies comprising lateral GaN power transistors, where source, drain and gate contacts are provided on one side of the die. Mutual alignment and vertical interconnection of the multiple electrical interconnections of the components is facilitated.

The GaN die may comprise a plurality of lateral GaN power transistors and/or integrated driver circuitry. One or more lateral GaN die may be co-packaged together. For example, in some embodiments, multiple die or chips may be mounted on a common substrate. The device structure may comprise a second lateral GaN die or other semiconductor die, e.g. driver circuitry, interconnected by said first and second leadframe layers. For example two GaN chips packaged as described above may be mounted side-by-side on a common substrate, and interconnected to form a half-bridge circuit.

Thus, improved packaging and interconnect structures are provided for nitride semiconductor devices, such as GaN power transistors and systems using one or more GaN power transistors.

BRIEF DESCRIPTION OF THE DRAWINGS

In the drawings, identical or corresponding elements in the different Figures have the same reference numeral, or corresponding elements have reference numerals incremented by 100 in successive Figures.

FIGS. 8 and 9 show, respectively, front-side (top) and back-side (bottom) views of the assembled package of the first embodiment;

FIG. 10 shows a schematic cross-sectional view of the package assembly of the first embodiment mounted on a printed circuit board, for top-side cooling;

FIGS. 11 and 12 show, respectively, front-side (top) and back-side (bottom) views of an assembled package of a second embodiment;

FIG. 13 shows a schematic cross-sectional view of the package assembly of the second embodiment mounted on a printed circuit board;

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Embodiments of the present invention are described, which provide packaging solutions for large area GaN dies comprising lateral GaN power transistors.

Figure 1:
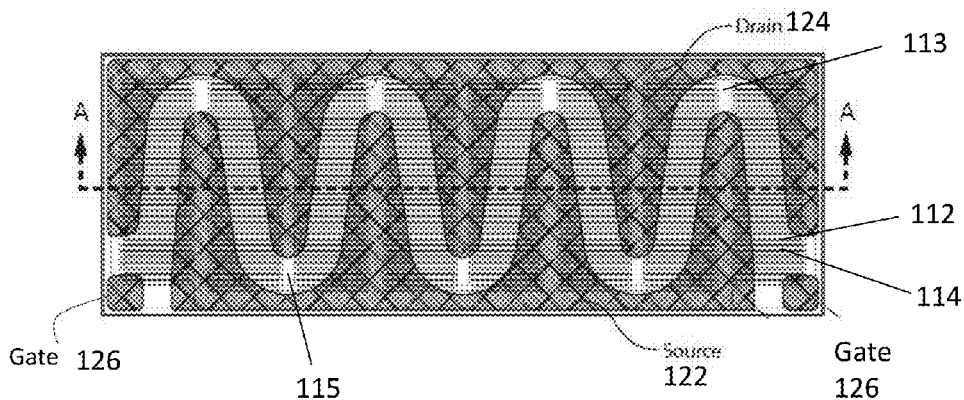
FIG. 1 shows a schematic front-side (top) view of the layout of an exemplary large gate width, lateral GaN power transistor die, showing large area source, drain and gate contact areas; underlying source, drain and gate electrodes; and interconnect metallization.
Figure 2:
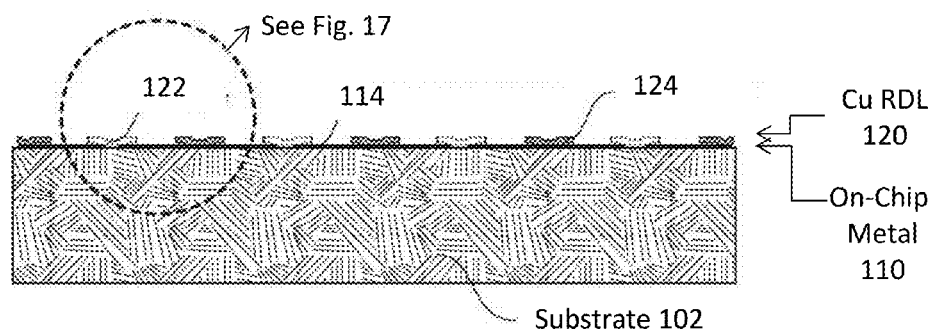
FIG. 2 shows a schematic cross-sectional view through line A-A of FIG. 1.
Figure 3:
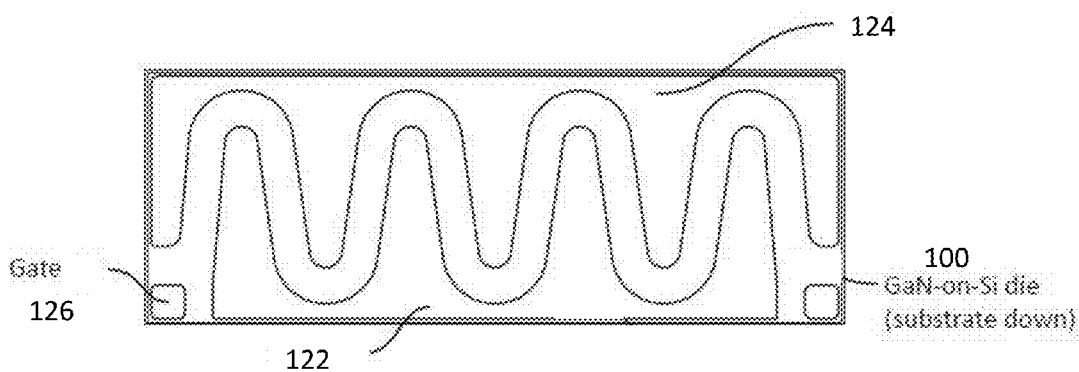
FIG. 3 shows a simplified schematic front-side view of FIG. 1.

FIGS. 1 to 3 illustrate schematically an exemplary large area, large gate width, lateral GaN power transistor die. FIG. 1 shows a schematic front-side view of the layout of the lateral GaN power transistor die 100, in which the layers are rendered with some transparency to show the structure of underlying layers, i.e.: a top layer defining large area source 122, drain 124 and gate 126 contact areas; underlying source electrodes 112 and drain electrodes 114; and an intervening layer of on-chip interconnect metallization defining source straps or interconnections 113 and drain straps or interconnections 115. The GaN transistor comprises a plurality of active areas or islands, comprising interdigitated/interleaved source and drain electrodes 112 and 114, with gate electrodes (not visible) running between the adjacent source and drain electrodes. The source electrodes 112 are electrically interconnected in parallel by the low resistance metal straps 113 defined by on-chip metallization, and the drain electrodes 114 are similarly electrically interconnected in parallel by the low resistance metal straps 115 defined by the on-chip metallization. An overlying relatively thick layer of metal, which in this embodiment comprises a Copper Redistribution Layer (Cu RDL), is formed thereon and patterned to form large area electrodes or contact areas, comprising a source portion 122 and a drain portion 124, corresponding to the arrangement of the source and drain contact areas of the underlying on-chip metal. The source portion of the Cu RDL 122 connects the underlying source metal straps 113 in parallel and the drain portion of the Cu RDL 124 connects the underlying drain metal straps 115 in parallel. The Cu RDL also provides gate contact areas 126 for the underlying gate electrodes. FIG. 2 shows a schematic cross-sectional view through line A-A of FIG. 1, to show the relatively thick Cu RDL 120 forming the large area source electrodes 122 and drain electrodes 124, which contact the underlying on-chip metal 110 of the source and drain, e.g. drain metal 114 to form respective source and drain interconnections.

FIG. 3 shows a simplified schematic front-side view of the lateral GaN die of FIG. 1, showing schematically the patterning of the Cu RDL defining the large area source and drain contact areas 122 and 124, and the gate contact areas 126, of the front-side of GaN die 100. This structure will be used as an example in describing packaging assemblies according to embodiments of the present invention. The thick Cu RDL layer provides low inductance interconnections which support the lateral current handling of the on-chip metal as well as providing interconnect contact areas (pad sizes) of sufficient size to match leadframe specifications.

By way of comparison, three prior art packages will first be described with reference to FIGS. 4, 5A and 5B, and 6A and 6B, respectively.

Figure 4:
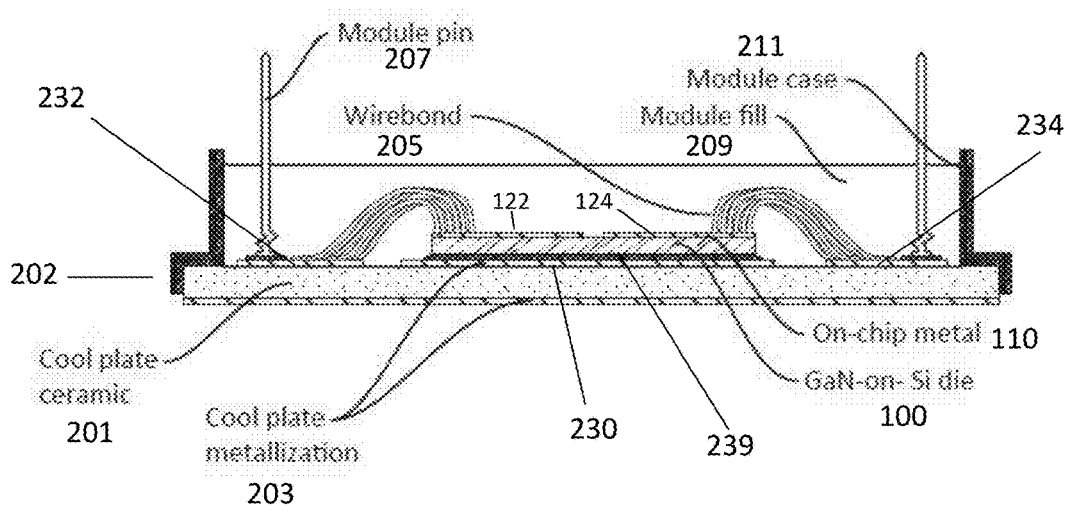
FIG. 4 (Prior Art) shows a packaging arrangement comprising an assembly of a bare GaN die, e.g. a lateral GaN power transistor fabricated on a silicon substrate (Ga-on-Si die), which is wirebonded in a conventional power module.

FIG. 4 (prior art) shows a conventional prior art packaging assembly of a lateral power transistor die 100, mounted on a substrate 202 of a power module and interconnected using wirebonds 205. The power transistor die 100, for example, comprises a lateral GaN power transistor fabricated on a silicon substrate (GaN-on-Si die/GaN die), having metal source, drain and gate contacts on the front-side (top) of the GaN die, such as illustrated in FIG. 3. The substrate 202 comprises a ceramic cool plate 201 (cool plate ceramic) which is metallized on both sides (cool plate metallization) with metal layers 203. The metal layer 203 on the front-side of the substrate 202 is patterned to define source contact area 232 and drain contact areas 234, near the edges on the front-side (top) of the ceramic plate 201, and a metal pad 230 in the middle of the ceramic substrate 201 is also provided for attaching the GaN-on-Si die 100. The back-side of the GaN-on-Si die is attached to the metal pad 230 of the ceramic substrate 202 using a standard die-attach material, e.g. solder or sintered layer. The source and drain contact areas 122 and 124 for the GaN transistor are provided by on chip metallization layers (i.e. on-chip metal 110 and/or Cu RDL 120). These contact areas 122 and 124 are wirebonded by multiple wire bonds 205 to respective source and drain metal contact areas 232 and 234 of the ceramic substrate 202 of the module. The die-attach material 239 provides for thermal contact of the GaN die with the ceramic substrate 202 to provide for heat dissipation. Gate connections between the GaN-on-Si die and gate contact areas of ceramic substrate are similarly provided using wirebonds. After the GaN die 100 is mounted on the substrate of the module and wirebonded, the module case 211 is filled with module fill 209, i.e. a suitable dielectric encapsulation material. The module pins 207 provide respective source, drain and gate contacts for the lateral GaN transistor on the GaN-on-Si die 100.

Figures 5A, 5B:
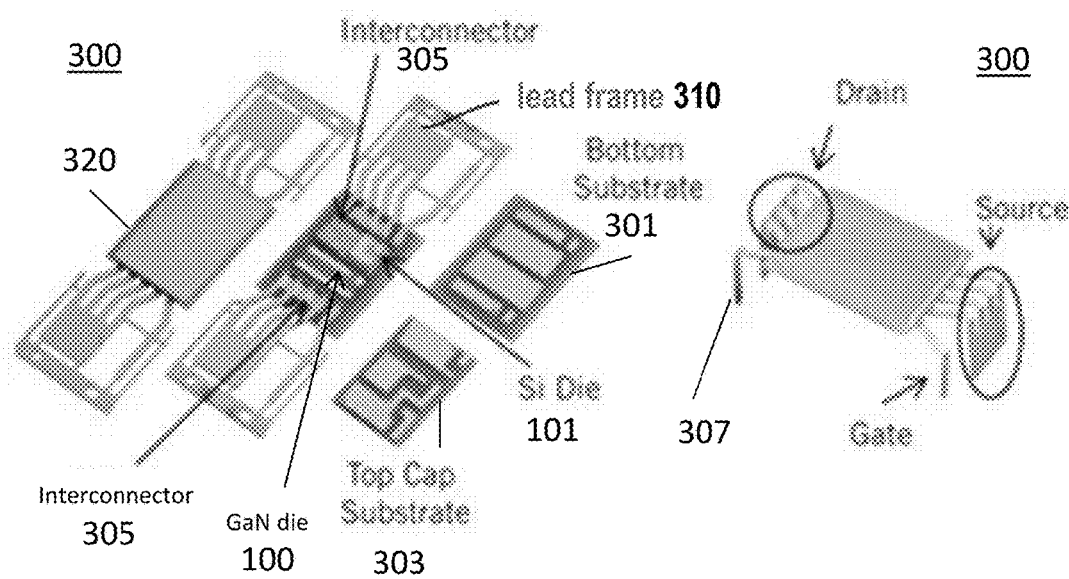
FIGS. 5A and 5B (Prior Art) show views of another arrangement for co-packaging a GaN power transistor die and a silicon die, wherein the two die and leadframe components are sandwiched between and interconnected with metallization of a bottom substrate and a top cap substrate of the package.

FIGS. 5A and 5B (prior art) show schematically another known arrangement for co-packaging a GaN power transistor die 100 and a silicon die 101. FIG. 5A shows components comprising the two die, 100 and 101, an interconnector 305 comprising leadframe components 310, and an assembly 320 of the components. The two die are sandwiched between the bottom substrate 301 and a top cap substrate 303 of the package, with interconnectors 305 interconnecting the components with the two leadframe components 310. The top substrate 303 and bottom substrate 301 comprise, for example, a Direct Bonded Copper (DBC) board providing metal contact areas for the GaN die 100 and the Si die 101 and other components. The GaN die and Si die and an interconnector 305 comprising left and right leadframe components 310 are aligned to respective contact areas and sandwiched between the bottom substrate 301 and the top cap substrate 301, thereby electrically interconnecting the components. After the top and bottom substrates have been bonded together the leadframes are trimmed and formed to provide drain, source and gate leads 307 as illustrated in FIG. 5B.

Figure 6A:
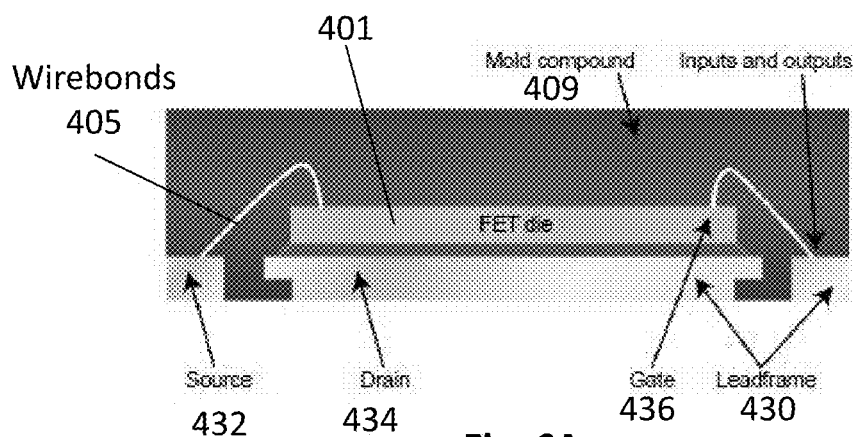
FIGS. 6A and 6B (Prior Art) show two views of another packaging arrangement of a power transistor die in a PQFN package, wherein the die is wirebonded to the PQFN leadframe.
Figure 6B:
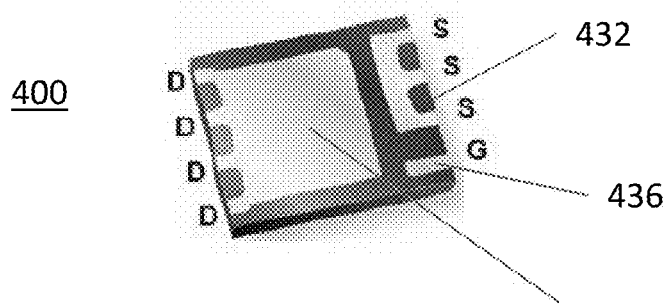

FIGS. 6A and 6B (prior art) shows another conventional arrangement for packaging a vertical power transistor die 401 in a PQFN package 400, wherein the die is wirebonded to the PQFN leadframe 430. The leadframe 430 comprises a large area drain contact area 434, a source contact area 432, and a drain contact area 436. The back-side of the die 401 is attached to the drain contact area 434 with a layer of die attach material, and the source and gate pads on the front-side of the die 401 are interconnected to respective source contact 432 and drain contact 436 of the leadframe 430 with wirebonds 405, as illustrated in the cross-sectional view in FIG. 6A, and encapsulated with mold compound 409. As shown in FIG. 6B, parts of the leadframe providing the respective source, drain and gate pads, i.e. 432, 434 and 436, are exposed on the back side of the package 400.

Figure 7:
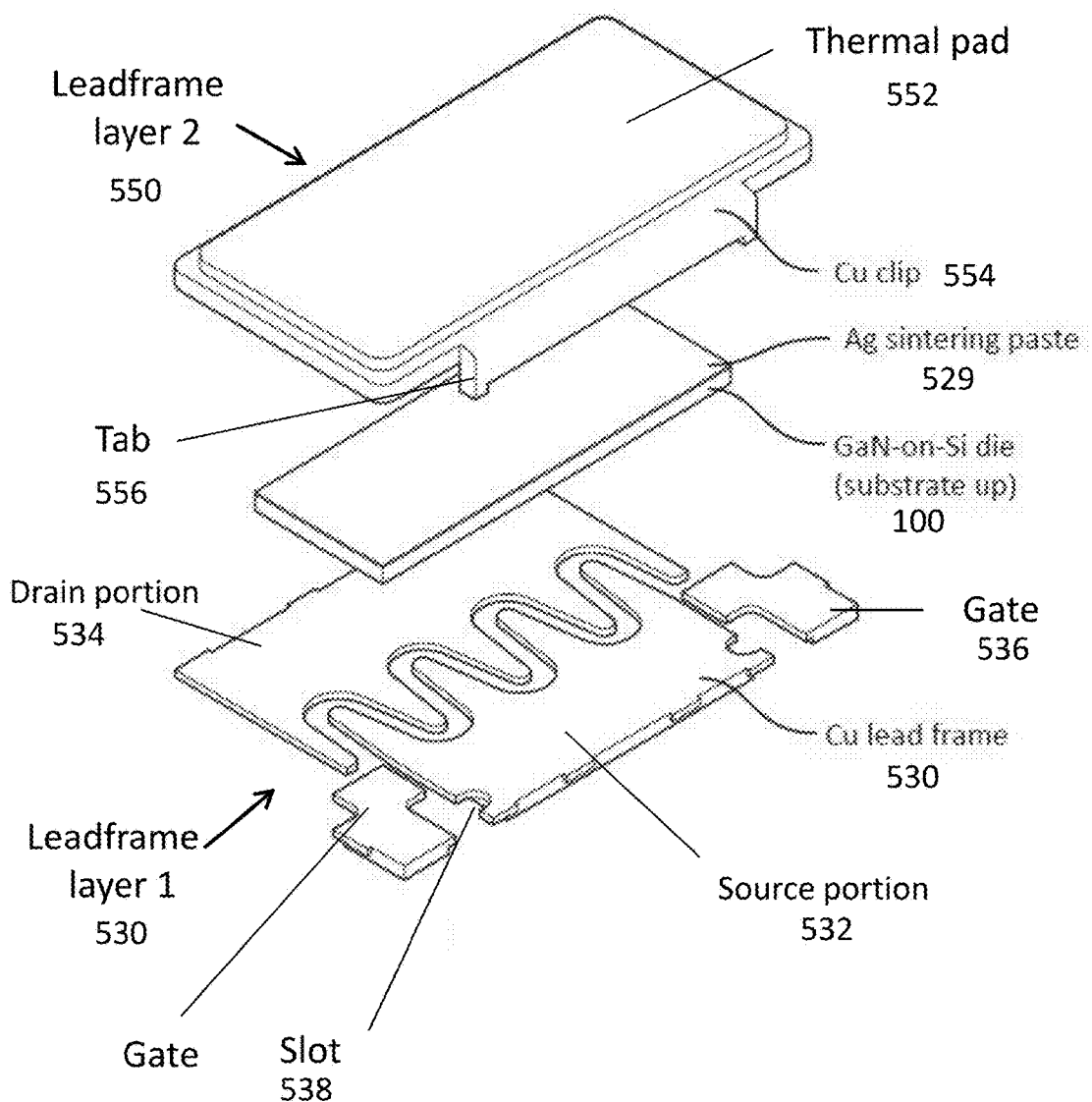
FIG. 7 shows a schematic exploded view of components of a packaging assembly comprising a lateral GaN die according to a first embodiment of the present invention.

FIG. 7 shows a schematic exploded view of components of a packaging assembly 500 comprising a lateral GaN die 100, according to a first embodiment of the present invention. The lateral GaN die 100 is flipped (substrate up) and sandwiched between first and second copper leadframe layers 530 and 550. The first leadframe layer 530 is a patterned copper leadframe having a source portion 532, a drain portion 534 and gate portions 536, respectively. The second leadframe 550 comprises an area forming a thermal pad 552, and also provides a source clip 554, which extends laterally and downwards to provide for a vertical connection to the corresponding source portion 532 of the first copper leadframe layer 530. By way of example, in this embodiment, the first copper leadframe layer is patterned to form source, drain and gate portions that are arranged to match, or correspond to, the arrangement of source, drain and gate contact areas of the GaN die shown in FIG. 3, and which extend laterally of the GaN die. The copper leadframe layers may provide registration means, e.g. tabs 556 on the clip part 554 of the second leadframe layer 550 that register to corresponding recesses or slots 538 in the source portion of the first leadframe layer 530, to facilitate registration, i.e. vertical and horizontal alignment of the components of the first and second leadframes during assembly. The components are assembled using a low inductance and highly thermally conductive attachment material, for example, using silver (Ag) sintering to attach the back-side of the GaN die 100 to a die-attach area on the underside of the second leadframe layer 552. The respective source, drain and gate contacts on the front-side of the GaN die are electrically connected to the respective source, drain and gate portions, 532, 534 and 536, of the first leadframe layer 530 using metal bump or post connections, comprising appropriate low inductance interconnect materials, as will be described in more detail with reference to the cross-sectional view shown in FIG. 10, and the enlarged cross-sectional view, of a metal post connection comprising a solder tipped copper pillar, shown in FIG. 17.

FIGS. 8 and 9 show back-side (bottom) and front-side (top) views of the assembled package 501, after encapsulation with plastic molding 509. The package resembles a conventional PQFN package, with exposed contact pads for the source 532, drain 534 and gate 536 on the back-side of the package (FIG. 8). There is an exposed area of the second leadframe 550 providing the thermal pad 552 on the other side, for thermal dissipation (FIG. 9).

FIG. 10 shows a schematic cross-sectional view through the assembled package, through plane A-A of FIGS. 8 and 9, after mounting on a substrate comprising a Printed Circuit Board (PCB) 560. The die 100 is attached to the first leadframe 550, which forms a copper clip and comprises the thermal pad 552, by a conductive layer 529 comprising sintered silver (Ag). As illustrated, the source, drain and gate contacts of the package are soldered to respective copper traces 562 for source, drain and gate tracks of the PCB 560. The encapsulation 509 leaves part of the copper clip, i.e. the thermal pad 552, exposed to provide a cooling path on the top-side of the assembly when it is mounted on the PCB. The copper clip 554 of the second leadframe layer also provides an interconnection to ground the substrate of die to source potential. For low inductance interconnections, this arrangement provides for the contact areas for the source, drain and gate of the GaN die 100 to be electrically connected to respective source drain and gate portions of the leadframe using suitable bump or post connections 528. A preferred method for attaching the GaN die to the first leadframe layer of the package uses solder tipped Cu pillars or posts 528 to attach the source, drain and gate contact areas of the GaN die to the respective source, drain and gate contact portions of first leadframe layer. The use of copper posts for low inductance interconnections is illustrated schematically in the enlarged cross-sectional view in FIG. 17.

Figure 17:
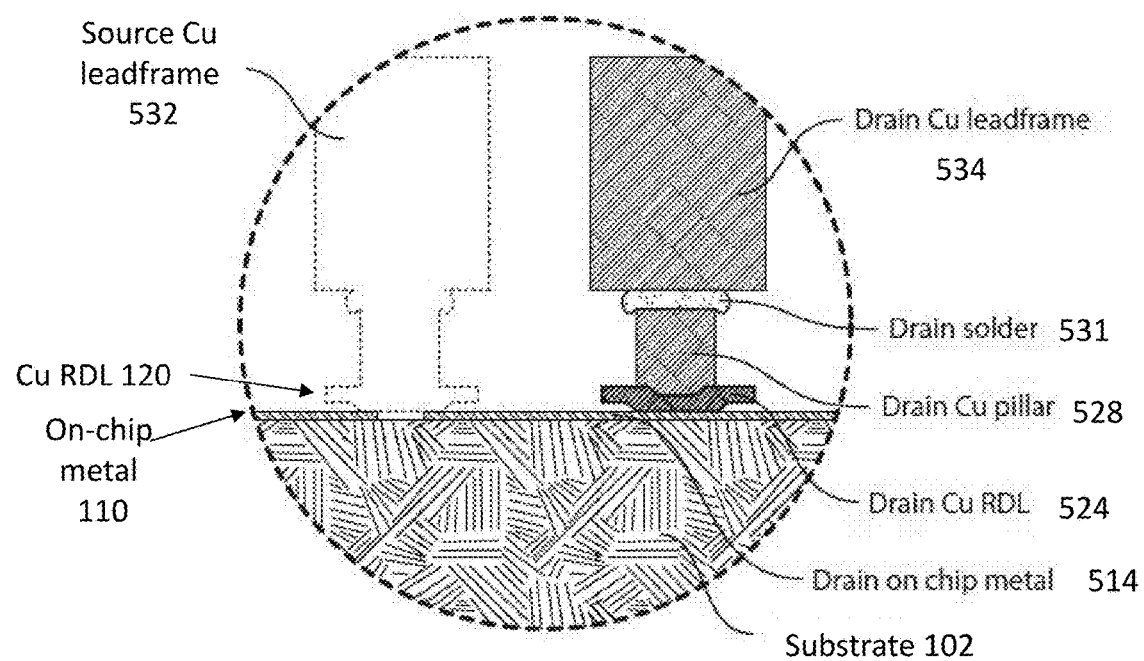
FIG. 17 shows an enlarged schematic cross-sectional view of part of registration, vertically and horizontally, showing a solder tipped copper pillar connection between a drain contact provided by on-chip metal and a Cu RDL layer on the GaN die and a respective drain copper leadframe portion.

FIG. 17 shows an enlarged cross section through one drain interconnection, in which the drain Cu RDL 124 contacts the underlying drain contact area of the on-chip metal 114, as described with reference to FIG. 2. The overlying drain portion 534 of the first leadframe 550 is interconnected to the drain Cu RDL 124 by a solder tipped copper pillar, i.e. copper pillar 528 and solder 531. This type of interconnect provides for significantly reduced interconnect inductance relative to conventional wirebonds.

As illustrated in the cross-sectional view in FIG. 10, a layer of electrically conductive and thermal conductive attachment material 529 is provided for die-attach to the die-attach area of the second leadframe layer and for interconnection and attachment of the respective source portions of the first and second leadframe layers. For copper leadframe layers, and a silicon semiconductor substrate, a preferred attachment material 529 is a layer of sintered silver.

FIGS. 11 and 12 show top and bottom views of a packaging assembly 600 according to a second embodiment, which is configured for back-side cooling when mounted on a PCB 660, i.e. through the PCB substrate, as illustrated in the cross-sectional view in FIG. 13. From the top view of the package, FIG. 11, the first leadframe layer forming the source, drain and gate portions 632, 634 and 636 is encapsulated with molding compound 609 and are not externally visible. As shown in FIG. 12, from the bottom view of the package, the source/thermal pad 652, drain pad 654 and gate pads 656 are exposed. The GaN die 100 is sandwiched between first and second copper leadframe layers 630 and 650, as shown in FIG. 13, but package components and the orientation of the GaN die 100 are flipped relative to those illustrated in FIG. 7 for the first embodiment. Similar to the first embodiment, the first leadframe 630 is patterned to define source, drain and gate portions 632, 634 and 636, as represented by the respective dotted outlines in FIG. 11. The second leadframe provides an exposed source contact area and thermal pad 652. The external source contact area is formed by an exposed part 652 of the second leadframe layer that also forms the thermal pad.

FIG. 13 shows a cross section of the structure through lines A-A of FIGS. 11 and 12. The structure in FIG. 13 is shown mounted on a printed circuit board 660, and attached to copper traces 662 of the PCB 660 by solder 664. As in the first embodiment, the GaN die is attached to the second leadframe layer, by a low inductance layer 629 of an electrically and thermally conductive material, such as sintered silver. The second leadframe layer 650 provides the source pad 652 that also acts as the thermal pad, and also comprises a portion 656 that extends to form a copper clip. The portion 656 connects vertically to the source portion 632 of the first leadframe layer. The patterned copper leadframe layer 630 comprising source, drain and gate portions 632, 634 and 636 is electrically connected to respective source, drain and gate contact areas of the GaN die. The copper clip 652 is electrically connected to the source portion 632 of the leadframe and is the thermal pad area 652 is exposed to form the external source pad of the package. Drain and gate portions of the second copper leadframe layer, i.e. copper blocks 654 for the drain and gate, electrically connect to the respective drain and gate portions of the leadframe. The copper blocks 654 located on the drain and gate leadframe islands are exposed on the bottom of package providing external pads for the drain and gate. Thus, all electrical connections are brought to the same side as the thermal pad/source pad provided by the exposed surfaces of the copper clip (second leadframe layer). When the package is mounted on a substrate such as a PCB, as shown in FIG. 13, the drain pad is soldered to the copper drain trace of the PCB and the source pad is soldered to the copper source trace of the PCB. The latter also provides for thermal dissipation through the substrate. For example, the PCB 660 may further comprise thermal vias (not illustrated) underlying the source copper trace of the PCB, for thermal dissipation.

Figure 14:
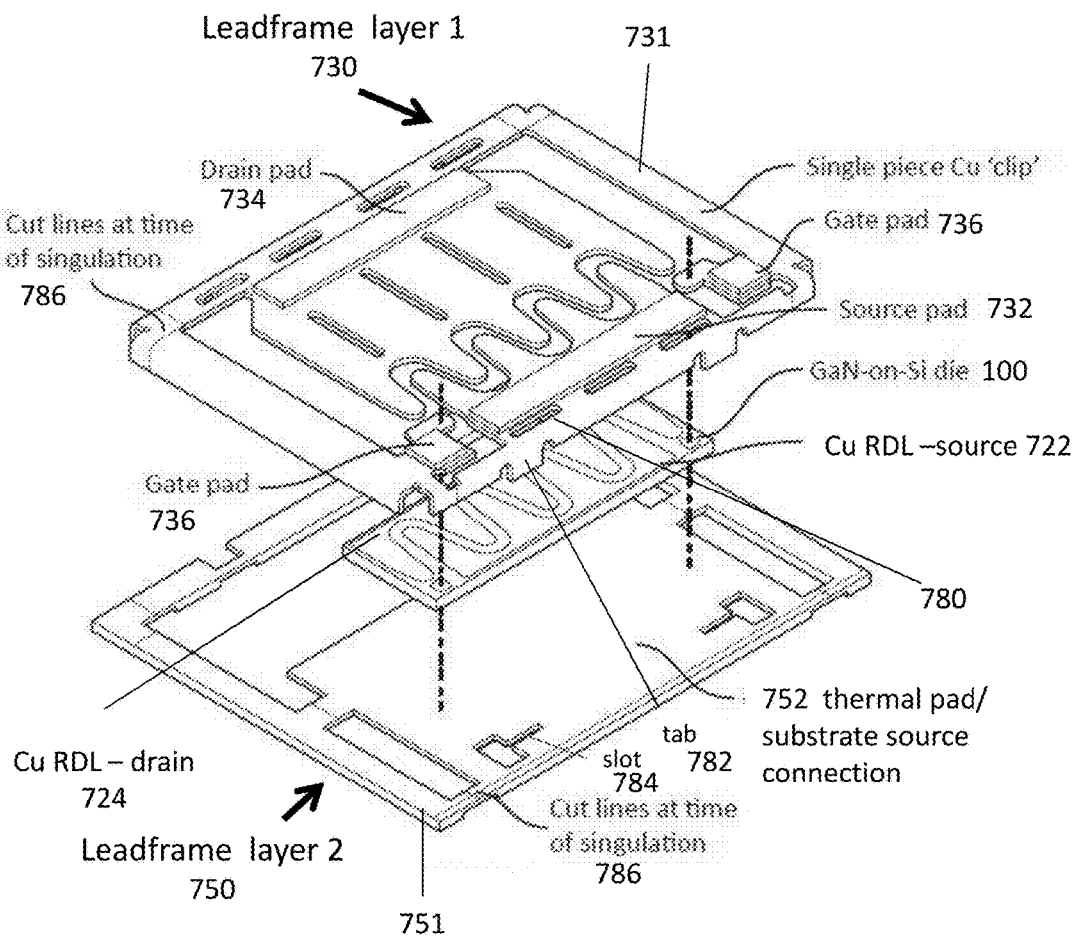
FIG. 14 shows an exploded view of components of a package assembly according to a third embodiment.

FIG. 14 shows an exploded view of components of a packaging assembly 700 according to a third embodiment. The GaN die 100 is sandwiched between first and second copper leadframe layers 730 and 750, each taking the form of a leadframe comprising a supporting frame. The second, underlying, copper leadframe layer 750 comprises a supporting frame 751, and provides a substrate thermal pad 752 on which the substrate of the GaN die is attached, e.g. using a layer of silver sinter, as for the first and second embodiments. The first, overlying, copper leadframe layer 730 is patterned to provide source, drain and gate portions, i.e. 732, 734 and 736, respectively. During assembly, the source, drain and gate portions are held together by the surrounding support frame 731. The support frame 731 is formed to provide a sidewall around the edges, and forms part 780 of the source clip extending vertically along one side from the source portion 732 of the leadframe 731. The sidewall part 780 of the source clip has protruding tabs 782 that register with and engage corresponding openings (slots) 782 in the source/thermal pad 752 of first leadframe 750 when the components are assembled. During assembly, the sidewalls of the support frames 731, which extend around the structure of the first leadframe 730 and aligns to edges of the corresponding support frame 751 of the second copper leadframe layer 750. After assembly of the GaN die and components of the first and second leadframe layers, the structure is singulated by cutting along singulation lines 786 indicated by fine dotted lines in FIG. 14. The structure is then encapsulated to provide the package as illustrated in FIGS. 15 and 16.

Figures 15, 16:
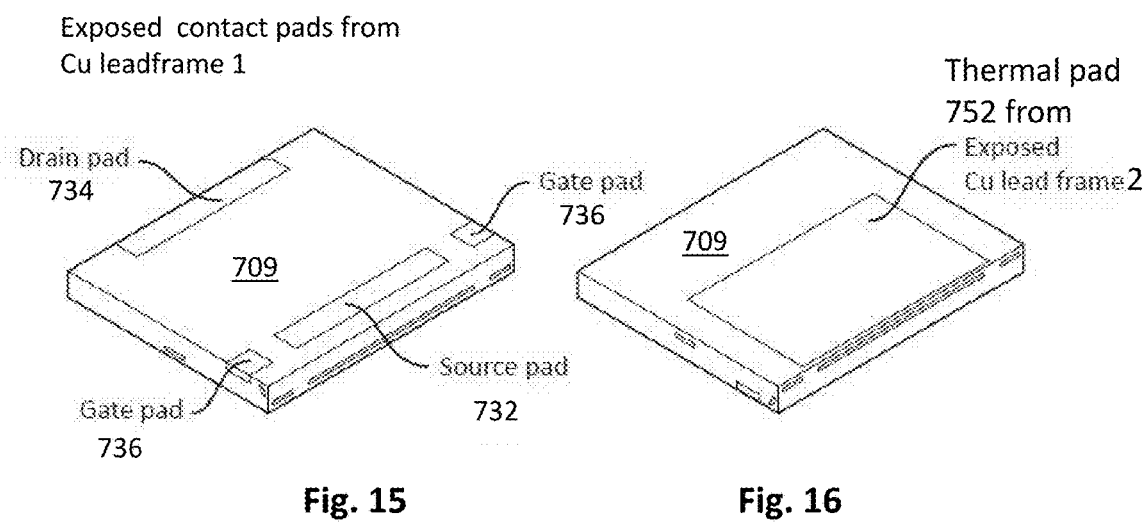
FIGS. 15 and 16 show, respectively, front-side and back-side perspective views of the package assembly of the third embodiment.

FIGS. 15 and 16, respectively, show front-side and back-side perspective views of the assembled package, after an over-molding of encapsulation material 709 has been formed and after the individual components of the clip are singulated from the supporting frame. As shown in FIG. 14, when the lateral GaN die is sandwiched between the first and second leadframe layers, the supporting frame of the first and second leadframe layers extends beyond the outline of the final package on three sides. The supporting frame is cut on three sides during device singulation, as indicated by fine dotted lines, leaving one side of the sidewall of the leadframe, attached to the source portion. Thus, after assembly, the remaining sidewall provides part of the source clip which extends laterally and vertically of the GaN die and electrically connects to the second leadframe layer, i.e. to tie the substrate/thermal pad to the source. Each resulting part of the first copper leadframe layer forms a single interconnect to the die, i.e. individual drain, source and gate interconnects. The thicker parts of the first leadframe form the exposed source, drain and gate pads, 732, 734 and 736, respectively, on the underside of the finished package as shown in FIG. 15, similar to a conventional PQFN package. As shown in FIG. 16, the exposed part 752 of the second leadframe 750 forms the source/thermal pad on the other side of the finished package. Cut edges from removal of the supporting frames of the first and second leadframe layers are visible on sides of the package. While the structure of the second leadframe 750 is more complex than that of the first and second embodiments, alignment and registration of the components and their interconnections is facilitated. Thus, overall fabrication is simplified.

Alternative Embodiments

While several embodiments have been described in detail, with reference to a GaN die such as illustrated in FIG. 3, it will be appreciated that variations and modifications may be made to these embodiments.

For example, the packaging assemblies of the embodiments described herein may be adapted for GaN dies comprising lateral GaN devices with alternative layouts. Packages with other external contact arrangements, e.g. comprising single or multiple external pads for each of the source, drain and gate connections may be provided. Optionally, the package includes an additional external contact pad, e.g. a source sense (Kelvin) connection.

Although the embodiments described above refer to first and second copper leadframe layers, the leadframe layers may comprise one or more layers or sheets of copper or copper alloys typically used for leadframes, i.e. copper and copper alloys having high electrical conductivity and high thermal conductivity. The first and second leadframe layers may be patterned from first and second leadframes comprising sheet or plate material, by any suitable process, such as forming, etching and/or half etching.

Instead of copper and copper alloys, other suitable metals and metal alloys, or composites, which are typically used for semiconductor packaging components, may alternatively be considered, providing they have sufficient current capability and thermal conductivity, and an appropriate CTE.

For die-attach, a layer of sintered silver is preferred as a low inductance, and thermally conductive die-attach material, to provide both an electrical connection and thermal connection of the back-side of the GaN die and the second copper leadframe layer comprising the thermal pad and source clip. Alternatives to sintered silver comprise, for example, silver impregnated epoxy, lead free solder, or similar die-attach materials.

For the low inductance electrical connections between the source, drain and gate contact areas of the GaN die to the respective source, drain and gate portions of first copper leadframe layer, are preferably metal bump or metal post connections using interconnect materials that are excellent electrical conductors, capable of withstanding power cycling, and where possible be lead-free. Sintered silver provides excellent electrical conductivity and is conductivity and is also an excellent thermal conductor. Solder tipped copper pillars are preferred. For soldered connections, lead-free solder is preferred. A plurality of copper bumps, posts or pillars may be formed integrally with the first copper leadframe layer, e.g. by a half-etch process. Contacts between bumps or posts of half-etched leadframe and on-chip metal/Cu-RDL source, drain and gate contacts may be made using some form of solder. Other suitable conventional metal bump and post connections may be used.

Assembly

During assembly, typically, the GaN die is first attached to the die-attach area of the first leadframe layer, e.g. using the selected die-attach material and process, such as, silver sintering or solder reflow. The interconnect material for the second leadframe layer is printed, patterned or otherwise attached to the second leadframe layer, e.g. by solder reflow/cure. Then, the second leadframe layer with the patterned layer of interconnect material or, e.g., an array of a plurality of posts or pillars is placed on the die, aligned to respective source, drain and gate contact areas.

Some form of registration means, e.g. tabs and slots, assists in laterally and vertically aligning the multiple interconnections, e.g. copper pillars, and components of the first and second leadframe layers during assembly. During reflow or curing of the attachment and interconnect materials, such as, solder or conductive epoxy, the material tends to center itself in the opening of the contact area or plated area for each pillar of the leadframe, thus there is some self-centering during this process.

For encapsulation, a small/fine grained over-molding compound, e.g. <25 µm grain size, is required to get in between the plurality of copper pillars and under the GaN die. Currently, this is an unusually small grain size for an over-molding/encapsulation compound for regular PQFN package manufacturing.

Beneficially, in embodiments described above, each of the first and second leadframe layers is structured so it can be patterned from a single sheet of copper, and preferably the component portions of the leadframe layer are held together with a supporting frame during assembly. In some embodiments, one of the leadframe layers acts as a clip, with a portion extending vertically to interconnect with a respective portion the other leadframe layer. Alternatively, one or both of the leadframe layers may be formed from multiple parts, e.g. may further comprise copper blocks which interconnect with other parts, and/or may comprise a multilayer or composite structure.

During fabrication of packaging assemblies for the first and second embodiments, although not illustrated, the components or portions of the first and second copper leadframe layers may be tied together by surrounding support frames during assembly, similar to that illustrated for the third embodiment. Advantageously, the packaging assembly of the third embodiment comprises first and second leadframes comprising a supporting frame with tabs and slots, inter-engaging tabs, which facilitate vertical and horizontal alignment of the parts during assembly.

In alternative embodiments, the first and second leadframes are structured with registration means, such as, inter-engaging tabs and slots, inter-engaging tabs, pins, openings, or other forms of alignment parts, to facilitate alignment and registration of the multiple high current/low inductance interconnections, such as metal posts or pillars, with respective source, drain and gate contact areas of the lateral GaN transistor which are provided on the front-side GaN die.

In preferred embodiments described, the leadframes are structured so that components of the first and second leadframe layers are held together by a supporting frame during assembly, and separated into their components during regular device singulation process steps, without requiring additional process steps.

Performance Considerations

Device structures according to preferred embodiments adapt elements of PQFN technology for packaging GaN die comprising lateral GaN power transistors, where all source, drain and gate contact areas are provided on one side of the GaN die, without wirebonding. In particular, the resulting package assembly can be configured for GaN switching devices comprising lateral GaN power transistor, including high current/high voltage switches, where low inductance interconnections and effective thermal dissipation are required.

Since the GaN die is sandwiched between the first and second leadframe layers, and interconnected directly with large area, low inductance interconnections, i.e. eliminating wirebonding, interconnect inductance is significantly reduced relative to wirebonded packages. For example, whereas a 25 µm bond wire may have an inductance of ~1 nH/mm, a copper pillar of diameter from 50 µm to 100 µm, and a height of 200 µm, has been reported to have inductance of ~100 pH (Ate He, et al., J. Electrochem. Soc. 155(4) D314-D322 (2008)).

For thermal dissipation, the dual leadframe package assembly can be configured for either front-side or back-side cooling, and thus the first and second leadframe layers preferably comprise copper, copper alloys or other metals and/or metal alloys, comprising e.g. copper, silver and gold, or composites, having both high electrical conductivity and high thermal conductivity.

Embodiments have been described, by way of example, comprising a packaging assembly for one GaN die comprising a lateral GaN power transistor. In other embodiments, for example, for GaN power systems, more than one GaN die comprising one or more lateral GaN power transistors and/or diodes may be co-packaged within one module or on a common substrate, and/or a GaN die comprising a lateral GaN power transistor may be co-packaged with other components, such as driver circuitry. The lateral GaN power device or devices may further comprise integrated driver circuitry.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A semiconductor device structure comprising an assembly of:
   a lateral Gallium Nitride power transistor fabricated on a semiconductor substrate (GaN die) and packaging components comprising first and second leadframe layers;
   the GaN die comprising a front surface providing source, drain and gate contact areas for the lateral GaN power transistor and a back surface for die-attach;
   the GaN die being sandwiched between the first and second leadframe layers;
   the first leadframe layer being patterned to provide source, drain and gate portions corresponding to source, drain and gate contact areas on the front surface of the GaN die;
   the second leadframe layer comprising a thermal pad and a die-attach area for the back surface of the GaN die;
   the back surface of the GaN die being attached to the die-attach area of the second leadframe layer by a low inductance layer of an electrically and thermally conductive attachment material;
   the source, drain and gate contact areas of the GaN die being attached and electrically connected to respective source, drain and gate portions of the first leadframe layer by low inductance interconnections; and a package body comprising an over-molding of encapsulation which leaves exposed the thermal pad of the second leadframe layer and leaves exposed external contact pads for the source, drain and gate of the lateral GaN transistor.

2. The device structure of claim 1, wherein the external pads for the source, drain and gate contacts are part of the first leadframe layer and are provided on one side of the package body and the thermal pad is provided on an opposite side of the package body.

3. The device structure of claim 2, wherein the second leadframe comprising the thermal pad further comprises a source clip, which extends laterally of the die substrate, and is vertically interconnected to the source portion of the first leadframe layer, thereby providing a substrate source connection for grounding the die substrate to the source.

4. The device structure of claim 1, wherein the second leadframe layer comprises source, drain and gate portions, and the external contact pads for the source, drain and gate comprise part of the respective source, drain and gate portions of the second leadframe layer; and wherein the respective source, drain and gate portions of the first and second leadframe layers are vertically interconnected, within the package body, by low inductance interconnections comprising a layer of electrically and thermally conductive material, and each of the external pads for the source, gate and drain contacts and the thermal pad are provided on one side of the package body.

5. The device structure of claim 4, wherein the thermal pad is part of the source portion of the second leadframe layer and is grounded to the source portion of the first leadframe layer within the package body, such that the thermal pad provides the external pad for the source contact, and the drain and gate portions of the second leadframe layer are electrically connected to respective drain and source portions of the first leadframe layer, said drain and gate portions of the second leadframe layer providing external pads for drain and gate contacts on the same side of the package body as the external pad providing the source contact and thermal pad.

6. The device structure of claim 5, wherein the second leadframe layer comprising the thermal pad further comprises a source clip, which extends laterally of the die substrate and is vertically interconnected to the source portion of the first leadframe layer, thereby providing a substrate-source connection for grounding the die substrate to the source, wherein the exposed surface of the thermal pad acts as the substrate source contact area, and a drain clip portion of the second leadframe layer is formed laterally of the die substrate and is vertically interconnected to the drain portion of the first leadframe layer.

7. The device structure of claim 6, wherein the drain clip portion provides a drain contact area coplanar with the surface of the thermal pad which provides the source contact area.

8. The device structure claim 1, wherein the semiconductor substrate of the GaN die comprises a silicon substrate, and wherein the first and second leadframe layers comprise copper and/or a copper alloy with high electrical and thermal conductivity.

9. The device structure of claim 8, wherein the attachment material attaching the back surface of the GaN die to the die-attach area of the second leadframe layer comprises a layer of sintered silver.

10. The device structure of claim 1, wherein the semiconductor substrate of the GaN die comprises a silicon carbide substrate, wherein the first and second leadframe layers each comprise copper and/or a copper alloy with high electrical and thermal conductivity.

11. The device structure of claim 10, wherein the attachment material attaching the back surface of the GaN die to the die-attach area of the second leadframe layer comprises a layer of sintered silver.

12. The device structure of claim 1, wherein the low inductance interconnections comprise metal bump or metal post connections.

13. The device structure of claim 12, wherein the metal bump or metal post connections comprise copper pillars.

14. The device structure claim 1, wherein the semiconductor substrate of the GaN die comprises a silicon substrate, the first and second leadframe layers comprise copper and/or a copper alloy with high electrical and thermal conductivity, the attachment material comprises sintered silver, and the low inductance interconnections comprises solder tipped copper pillars.

15. The device structure of claim 1, wherein the first and second leadframe layers further comprising registration means for laterally and vertically aligning the first and second leadframe layers during assembly.

16. The device structure of claim 15, wherein the registration means comprises tabs on the first copper leadframe layer and corresponding slots in the second copper leadframe layer, the tabs and slots inter-engaging to mutually align the first and second leadframes.

17. The device structure of claim 15, wherein the registration means comprises tabs on the second copper leadframe layer and corresponding slots in the first copper leadframe layer, the tabs and slots inter-engaging to mutually align first and second leadframes.

18. The device structure of claim 1, further comprising a second lateral GaN die or other semiconductor die co-packaged with the said GaN die and interconnected therewith by said first and second leadframe layers.

19. A method of fabricating a semiconductor device structure comprising an assembly of: a lateral Gallium Nitride power transistor fabricated on a semiconductor substrate (GaN die) and packaging components comprising first and second leadframe layers encapsulated within a package body, the method comprising:
provinding the GaN die comprising a front surface comprising source, drain and gate contact areas for the lateral GaN power transistor and a back surface for die-attach;
providing a first leadframe layer and a second leadframe layer;
the first leadframe layer being patterned to provide source, drain and gate portions corresponding to source, drain and gate contact areas on the front surface of the GaN die;
the second leadframe layer providing a die-attach area for the back surface of the GaN die and a thermal pad;
attaching the back surface of the GaN die to the die-attach area of the second leadframe layer with a layer electrically and thermally conductive material forming a low inductance interconnection;
providing low inductance metal bump or metal post connections for source, drain and gate contact areas of the GaN die, and providing a layer of electrically and thermally conductive attachment material for any other surfaces to be electrically interconnected;
mutually positioning the first and second leadframes to align respective source, drain and gate contacts thereof, with bump or post connections and/or attachment material therebetween;

processing the bump or post connections and the attachment material to vertically attach, and thermally and electrically interconnect the source, drain and gate contact areas of the GaN die and respective source, drain and gate portions of the first copper leadframe layer; and providing a package body comprising an over-molding of encapsulation, exposing the thermal pad of second copper leadframe layer and exposing the external contact pads for the source, drain and gate of the lateral GaN transistor.

20. The method of claim 19, wherein the first and second leadframe layers each comprise a supporting frame surrounding said source, drain, gate or thermal pad portions and wherein the method further comprises removing said supporting frames of the first and second leadframe layers during device singulation.

21. The method of claim 19, wherein said first and second leadframe layers are provided with registration means comprising tabs of one of the leadframe layers for inter-engagement with slots of the other leadframe layer, and wherein the method further comprises inter-engaging said tabs and slots for mutual registration, vertically and horizontally, of the first and second leadframe layers.

\* \* \* \* \*